US011757282B2

(12) United States Patent
Stanek et al.

(10) Patent No.: US 11,757,282 B2
(45) Date of Patent: Sep. 12, 2023

(54) METHOD AND DEVICE FOR CONTROLLING AT LEAST ONE CIRCUIT BREAKER OF A POWER SYSTEM

(71) Applicant: Hitachi Energy Switzerland AG, Baden (CH)

(72) Inventors: Michael Stanek, Gebenstorf (CH); Soumya Kanta, Bangalore (IN)

(73) Assignee: HITACHI ENERGY SWITZERLAND AG, Baden (CH)

( * ) Notice: Subject to any disclaimer, the term of this patent is extended or adjusted under 35 U.S.C. 154(b) by 0 days.

(21) Appl. No.: 17/278,802

(22) PCT Filed: Sep. 24, 2019

(86) PCT No.: PCT/EP2019/075651
§ 371 (c)(1),
(2) Date: Mar. 23, 2021

(87) PCT Pub. No.: WO2020/064699
PCT Pub. Date: Apr. 2, 2020

(65) Prior Publication Data
US 2022/0037879 A1 Feb. 3, 2022

(30) Foreign Application Priority Data

Sep. 28, 2018 (IN) .............................. 201841036616
Oct. 10, 2018 (EP) ..................................... 18199596

(51) Int. Cl.
*H02H 3/06* (2006.01)
*H02H 11/00* (2006.01)
(Continued)

(52) U.S. Cl.
CPC ......... *H02H 11/007* (2013.01); *G01R 19/003* (2013.01); *H02H 3/066* (2013.01); *H02H 3/44* (2013.01)

(58) Field of Classification Search
CPC .......... H02H 3/44; H02H 3/105; H02H 3/162; H02H 3/33; H02H 3/16; H02H 3/0935;
(Continued)

(56) References Cited

U.S. PATENT DOCUMENTS 4,377,833 A * 3/1983 Udren ...................... H02H 3/44
323/211
6,611,068 B2 8/2003 Cratty
(Continued)

FOREIGN PATENT DOCUMENTS

CA 2671402 A1 8/2008
CN 103138228 A 6/2013
(Continued)

OTHER PUBLICATIONS

Nilsson, James W., & Riedle, Susan A. Electric Circuits 7th Edition. Pearson Prentice Hall. p. 218 (Year: 2005).*
(Continued)

*Primary Examiner* — Bryan R Perez
(74) *Attorney, Agent, or Firm* — Sage Patent Group

(57) ABSTRACT

A power system comprises a power source, a transmission line coupled to the power source through a circuit breaker, a shunt reactor coupled to the transmission line, and a current transformer connected in series with the shunt reactor. A method for controlling the circuit breaker of the power system comprises processing an output signal of the current transformer to obtain the voltage on the transmission line by determining a time derivative of a current sensed by the current transformer. The method further comprises performing, by at least one control or protection device, a control or protection operation (e.g., auto-reclosing) based on the determined time derivative of the current sensed by the current transformer.

17 Claims, 5 Drawing Sheets

(51) Int. Cl.
  *G01R 19/00* (2006.01)
  *H02H 3/44* (2006.01)
(58) Field of Classification Search
  CPC .. H02H 3/08; H02H 3/34; H02H 9/02; H02H 9/021; H02H 9/63; H02H 9/001; H02H 9/005; H02H 7/30; H02H 7/0833; H02H 7/001
  See application file for complete search history.

(56) References Cited

U.S. PATENT DOCUMENTS

| | | | |
|---|---|---|---|
| 7,723,872 | B2 | 5/2010 | Pilz et al. |
| 7,936,093 | B2 | 5/2011 | Kinoshita et al. |
| 8,032,260 | B2 | 10/2011 | Hill, III et al. |
| 8,744,637 | B1 | 6/2014 | Maragal |
| 9,659,721 | B1 | 5/2017 | Jyoti et al. |
| 2006/0273779 | A1 | 12/2006 | Dupraz et al. |
| 2008/0100140 | A1 | 5/2008 | Sorenson et al. |
| 2008/0123234 | A1* | 5/2008 | Koyama ............... H01H 9/56 361/71 |
| 2011/0211288 | A1 | 9/2011 | Koshizuka et al. |
| 2013/0234731 | A1 | 9/2013 | Tziouvaras |
| 2013/0234741 | A1 | 9/2013 | Tziouvaras |
| 2017/0358405 | A1* | 12/2017 | Talluri ................. H01H 9/563 |

FOREIGN PATENT DOCUMENTS

| | | |
|---|---|---|
| CN | 103795082 A | 5/2014 |
| CN | 105051997 B | 7/2019 |
| DE | 19612992 A1 | 9/1997 |
| JP | S60151408 A | 3/1985 |
| JP | 2004349001 A | 12/2004 |
| JP | 2008529227 A | 7/2008 |
| WO | 2014124660 A1 | 8/2014 |

OTHER PUBLICATIONS

International Search Report and Written Opinion dated Dec. 17, 2019 for International Application No. PCT/EP2019/075651, 14 pages.

Fröhlich, K. et al.; "Controlled Switching of HVAC Circuit Breakers: Guide for Application Lines, Reactors, Capacitors, Transformers (1st Part)"; Working Group 13.07; Electra No. 138, Apr. 1999; 26 pages.

Examination Report dated May 29, 2020 for Indian Patent Application No. 201841036616, 5 pages.

Extended European Search Report dated Apr. 10, 2019 for European Patent Application No. 18199596.0, 7 pages.

Japanese Office Action dated May 23, 2022 for Japanese Patent Application No. 2021-517387, 6 pages (including English translation).

Chinese Search Report, CN Patent Application No. 201980061082.1, dated Feb. 3, 2023, 2 pages.

600MW Thermal Power Unit Training, Xi'an Electric Power College, May 31, 2016, 4 pages.

First Office Action for Chinese Patent Application No. 2023020301111620, dated Feb. 3, 2023, 14 pages.

* cited by examiner

METHOD AND DEVICE FOR CONTROLLING AT LEAST ONE CIRCUIT BREAKER OF A POWER SYSTEM

CROSS-REFERENCE TO RELATED APPLICATIONS

This application is a 35 U.S.C. § 371 national stage application of PCT International Application No. PCT/EP2019/075651 filed on Sep. 24, 2019, which in turns claims foreign priority to European Patent Application No. 18199596.0 filed on Oct. 10, 2018, which in turn claims priority to Indian Patent Application No. 201841036616 filed on Sep. 28, 2018, the disclosures and content of which are incorporated by reference herein in their entirety.

FIELD OF THE INVENTION

The invention relates to methods and devices for controlling at least one circuit breaker of a power system. The invention relates in particular to methods and devices that allow at least one circuit breaker of a high or medium voltage system to be controlled. The invention relates in particular to methods and devices for controlled reclosing of at least one circuit breaker of a transmission line.

BACKGROUND OF THE INVENTION

Power systems, such as systems for high or medium voltage power transmission, are often equipped with one or several circuit breakers (CBs) to implement control and protection functions. After tripping of a CB, reclosing the CB with an appropriate timing is often desirable to minimize switching transients but may represent a considerable challenge.

FIG. 6 shows a basic single-line diagram of a power system 100 that uses a conventional technique for controlling reclosing of a CB. The system comprises a power source 2 and a CB 1. The CB 1 is arranged to energize and de-energize a transmission line 3. The transmission line 3 may be equipped with one or more shunt reactors 4, 9. The shunt reactor(s) 4, 9 is/are operative to compensate a capacitance of the transmission line 3. Shunt reactor 4 is arranged at the local end of the transmission line, close to the CB 1 and the power source 2. Another shunt reactor 9 may be arranged on the far end of the transmission line 3 or in another location along the transmission line 3.

On tripping of a CB 1, the healthy phases will generally retain a trapped charge voltage that oscillates at one or more frequencies determined by the parameters of the transmission line 3 and the reactor(s) 4, 9. When reclosing the CB 1, the trapped charge can cause high overvoltages up to 4 pu on the transmission line 3. The high overvoltages may cause severe stress on an insulation of the transmission line 3. The high overvoltages may cause operation of surge arresters.

One way of mitigating the risk of such high overvoltages occurring, is controlled reclosing. Each CB pole can be closed in a beat minimum of the differential voltage across the CB 1. A control or protection device 10 can be used to control reclosing of the CB 1.

The differential voltage across the CB 1 can usually not be measured directly, but has to be calculated as the difference of a source voltage $U_1$ and a line voltage $U_2$. While the source voltage (also referred to as busbar voltage) $U_1$ can be considered constant in both voltage amplitude and frequency, the voltage $U_2$ on the transmission line 3 cannot be considered constant in both voltage amplitude and frequency after the CB 1 has tripped, i.e., when a decision on reclosing has to be taken.

FIG. 6 illustrates a conventional control setup for controlled reclosing in which the control or protection device 10 obtains the source voltage $U_1$ from a source voltage transformer (VT) 7 arranged on the busbar, and the line voltage $U_2$ from a line VT 5 arranged on the local end of the transmission line 3.

However, common designs of voltage transformers are often tuned to nominal power frequency. This applies in particular to capacitive voltage transformers (CVTs). At different frequencies such as those appearing on the transmission line 3 after CB tripping, the transmission line VT 5 may exhibit significant error in both amplitude and phase. Conventional techniques that measure the line voltage $U_2$ using the transmission line VT 5 and calculate the voltage difference across the CB from the difference of the source voltage $U_1$ measured using the source VT 7 and the line voltage $U_2$ using the transmission line VT 5 may suffer from inaccurate predictions of the voltage difference across the CB 1 and its beat minima.

CIGRE WG 13.07, "Controlled Switching of HVAC Circuit Breakers: Guide for Application—Lines, Reactors, Capacitors, Transformers." $1^{st}$ part, *ÉLECTRA*, No. 183, April 1999, pp. 43-73. $2^{nd}$ part," *ÉLECTRA*, No. 185, August 1999, pp. 37-57 discloses controlled reclosing on shunt compensated transmission lines and discusses the challenge of obtaining a correct image of the line voltage signal $U_2$ after tripping.

U.S. Pat. No. 7,936,093 B2 discloses the use of a reactor current and time derivative of a source voltage for obtaining target instants for controlled reclosing. However, the method of U.S. Pat. No. 7,936,093 B2 assumes that zero crossings of the reactor current coincide with zero crossings of the time derivative of a source voltage. Such coincident zero crossings will not necessarily occur in practice, and/or it may take an unacceptably long time for such coincident zero crossings to be observed. The method of U.S. Pat. No. 7,936,093 B2 also assumes that the line frequency is constant, which may not always be the case after CB tripping.

US 2013/0234731 A1 discloses a capacitance-coupled voltage transformer.

JP 2004 349001 A discloses a circuit breaker. A phase control part and a frequency identification part are provided for outputting command signals.

DE 196 12 992 A1 discloses a system in which abrupt variations of currents and voltages are measured by detectors associated with protective equipment, which is activated automatically in the event of a fault.

SUMMARY

It is an object of the invention to provide improved methods and devices for performing control and/or protection operations in a power system. It is in particular an object of the invention to provide methods and devices for control and/or protection operations that can be used on transmission lines equipped with one or several shunt reactors and that allow more reliable controlled reclosing of a circuit breaker after tripping. It is in particular an object of the invention to provide methods and control or protection devices for controlled reclosing of a circuit breaker for a transmission line after tripping that can reliably operate without requiring zero crossings of the reactor current to coincide with zero crossings of the time derivative of a source voltage and/or without requiring the line frequency to be constant.

A method and a device as recited in the independent claims are provided. The dependent claims define embodiments.

According to embodiments, methods and devices are provided that calculate the line voltage from a time derivative of a current through a shunt reactor. Such methods and devices may perform controlled reclosing of a circuit breaker after tripping at a target time at which a difference between a source or busbar voltage $U_1$ and a derived line voltage calculated as $L \cdot dI_L/dt$ (where L is an inductance of the shunt reactor and $I_L$, is a current through the shunt reactor while the circuit breaker is open) is at or near zero or in a beat minimum of the differential voltage calculated as $U_1 - L \cdot dI_L/dt$. The methods and devices may use the value $L \cdot dI_L/dt$ as an estimate for the line voltage of the transmission line for other purposes, such as detecting an instant of line de-energization, detecting an extinction of temporary faults or secondary arcing, at least one protection function, and/or line synchronization.

The methods and devices according to embodiments may use a current transformer that is connected in series with a shunt reactor, which is arranged between an end of the transmission line and ground, to measure the current through the shunt reactor.

The current transformer may be an inductive transformer or may comprise a Rogowski coil or a Hall-effect sensor or a similar sensor adapted to measure a current signal. Output signals of the current transformer may be in analog form (such as current or voltage) or streams of digital signals on a process bus. If the current transformer comprises a Rogowski coil, its output voltage, which is by principle the derivative of the current, may be used directly as representation of the line voltage of the transmission line.

A method of controlling at least one circuit breaker of a power system is provided. The power system comprises a power source, a transmission line coupled to the power source through the circuit breaker, a shunt reactor coupled to the transmission line, and a current transformer connected in series with the shunt reactor. The method comprises processing an output signal of the current transformer, comprising determining a time derivative of a current sensed by the current transformer. The method comprises performing a control and/or protection operation based on the determined time derivative of the current sensed by the current transformer.

The control and/or protection operation may be performed by at least one control or protection device.

The control and/or protection operation may be performed automatically by the at least one control or protection device.

The shunt reactor may be designed to compensate the capacitance of the transmission line by an arbitrary degree, usually in a range from 30 to 80%.

Processing the output signal of the current transformer may comprise determining a line voltage on the transmission line based on the time derivative of the current sensed by the current transformer.

The circuit breaker may be a circuit breaker for a transmission line. Performing the control and/or protection operation may comprise controlling a reclosing of the circuit breaker after tripping of the circuit breaker.

The power system may comprise a voltage transformer connected to the power source and adapted to sense a source voltage of the power source or the busbar in at least one phase. The at least one control or protection device may control reclosing of the circuit breaker based on an output signal of the voltage transformer and the time derivative of the current sensed by the current transformer.

The control and/or protection operation may comprise controlling a target reclosing time at which the circuit breaker is reclosed based on the output signal of the voltage transformer and the time derivative of the current sensed by the current transformer.

The control or protection device may comprise a point-on-wave controller.

The point-on-wave controller may predict differential voltage signals across the circuit breaker when the circuit breaker is open to identify future beat minima, based on the output signal of the voltage transformer indicative of $U_1$ and based on the calculated line voltage $L \cdot dI_L/dt$ derived from the time derivative of the shunt reactor current.

The point-on-wave controller may forward individual reclosing commands to each circuit breaker pole.

The controlled reclosing may comprise controlling the target closing time such that $U_1 - L \cdot dI_L/dt$ (where $U_1$ is the source voltage sensed by the voltage transformer, L is an inductance of the shunt reactor, and $I_L$ is the current through the shunt reactor while the circuit breaker is open sensed by the current transformer) is at or near zero at the target reclosing time.

Processing the output signal of the current transformer may comprise multiplying the time derivative of the current sensed by the current transformer by an inductance of the shunt reactor or by another suitable scaling factor.

The method may further comprise receiving the inductance of the shunt reactor. The inductance of the shunt reactor may be received at an interface of the control or protection device. The inductance of the shunt reactor may be read from a physical rating plate of the shunt reactor, from a data sheet of the shunt reactor, or from a computerized record representing technical data of the shunt reactor, and may be received at a user interface or data interface of the control or protection device.

The method may further comprise determining the inductance of the shunt reactor in a calibration that uses the output signal of the voltage transformer measured while the circuit breaker is closed and the time derivative of the current sensed by the current transformer while the circuit breaker is closed.

The inductance of the shunt reactor may be determined based on at least one peak value, root mean square (RMS) value or other average value of the output signal of the voltage transformer while the circuit breaker is closed and at least one peak value, RMS value or other average value of the time derivative of the current sensed by the current transformer while the circuit breaker is closed.

The inductance of the shunt reactor may be determined as a quotient of a peak value or RMS value of the output signal of the voltage transformer while the circuit breaker is closed and a peak value or RMS value of the time derivative of the current sensed by the current transformer while the circuit breaker is closed.

The inductance of the shunt reactor may be determined as a quotient of an average of several peak values or RMS values of the output signal of the voltage transformer while the circuit breaker is closed and an average of several peak values or RMS values of the time derivative of the current sensed by the current transformer while the circuit breaker is closed.

The method may further comprise using the time derivative of the current sensed by the current transformer to perform one or several of: detecting an instant of line de-energization; detecting an extinction of temporary faults or secondary arcing; at least one protection function; line synchronization.

The method may be used for plural phases of a power system. For illustration, the method may be used for controlled reclosing on several phases of a power system. In a power system with plural phases, plural current transformers are provided for the different phases. The output signals of the plural current transformers may be processed to determine time derivatives of the current for two or three phases, for example.

In the method, the control or protection device may perform the control and/or protection operation based on the determined time derivatives of the currents of the plural phases.

Performing the control and/or protection operation may comprise performing controlled reclosing of several circuit breakers or circuit breaker poles associated with different phases of the transmission line. The controlled reclosing may respectively be performed, for each phase, in dependence on an output voltage of the voltage transformer or a bulbar voltage for the respective phase and in dependence on the product of a shunt reactor impedance and the time derivative of the shunt reactor current measured by the current transformer for the respective phase.

A control or protection device for controlling at least one circuit breaker of a power system is provided. The power system comprises a power source, a transmission line coupled to the power source through the circuit breaker, a shunt reactor coupled to the transmission line, and a current transformer connected in series with the shunt reactor. The control or protection device comprises an input to receive an input signal representing a current sensed by the current transformer or a time derivative of the current sensed by the current transformer. The control or protection device comprises a control circuit adapted to perform a control and/or protection operation based on the time derivative of the current sensed by the current transformer.

The control or protection device may be adapted to calculate the time derivative of the current sensed by the current transformer.

The input of the control or protection device may be coupled to a computing device that calculates the time derivative of the current sensed by the current transformer.

The computing device may further be adapted to multiply the current sensed by the current transformer or the time derivative of that current by a suitable scaling factor such as the inductance of the shunt reactor.

The control or protection device may comprise a point-on-wave controller.

The point-on-wave controller may be adapted to control reclosing of a circuit breaker after tripping based on an output signal of a voltage transformer connected to the power source and a line voltage derived from the time derivative of the current sensed by the current transformer.

The point-on-wave controller may be adapted to predict differential voltage signals across the circuit breaker when the circuit breaker is open to identify future beat minima, based on a source voltage $U_1$ and based on a calculated line voltage $L \cdot dI_L/dt$ derived from the time derivative of the shunt reactor current.

The point-on-wave controller may be adapted to control the target closing time such that $U_1 - L \cdot dI_L/dt$ (where $U_1$ is the source voltage, L is an inductance of the shunt reactor, and $I_L$ is the current through the shunt reactor while the circuit breaker is open sensed by the current transformer) is close to zero at the target reclosing time.

The point-on-wave controller may be adapted to forward individual reclosing commands to each circuit breaker pole.

The control or protection device may have an interface to receive the inductance of the shunt reactor. The inductance of the shunt reactor may be read from a physical rating plate of the shunt reactor, from a data sheet of the shunt reactor, or from a computerized record representing technical data of the shunt reactor, and may be received at a user interface or data interface of the control or protection device.

The control or protection device may be adapted to determine the inductance of the shunt reactor in a calibration that uses the output signal of the source voltage transformer or load voltage transformer measured while the circuit breaker is closed and the time derivative of the current sensed by the current transformer while the circuit breaker is closed.

The control or protection device may be adapted to determine the inductance of the shunt reactor based on at least one peak value, RMS value or other average value of the output signal of the source voltage transformer or load voltage transformer while the circuit breaker is closed and at least one peak value, RMS value or other average value of the time derivative of the current sensed by the current transformer while the circuit breaker is closed.

The control or protection device may be adapted to determine the inductance of the shunt reactor as a quotient of a peak value or RMS value of the output signal of the source voltage transformer or load voltage transformer while the circuit breaker is closed and a peak value or RMS value of the time derivative of the current sensed by the current transformer while the circuit breaker is closed.

The control or protection device may be adapted to determine the inductance of the shunt reactor as a quotient of an average of several peak values or RMS values of the output signal of the source voltage transformer or load voltage transformer while the circuit breaker is closed and an average of several peak values or RMS values of the time derivative of the current sensed by the current transformer while the circuit breaker is closed.

When used for a power system having plural, e.g. three, phases, the control or protection device may be adapted to determine the inductance of the shunt reactor for each one of the plural phases.

The control or protection device may be adapted to perform, in any phase or phases of the power system, one or several of: detecting an instant of line de-energization; detecting an extinction of temporary faults or secondary arcing; at least one protection function; line synchronization.

The control or protection device may be adapted to perform the method of any aspect or embodiment of the invention.

The control or protection device may be adapted to perform controlled reclosing for circuit breakers or circuit breaker poles individually in any one or more phases of a power system. In a power system with plural phases, plural current transformers can be provided for the different phases.

The control or protection device may have inputs that are adapted to receive output signals of the plural current transformers that sense a shunt reactor current through shunt reactors of plural different phases of the transmission line.

The control or protection device may be adapted to effect a controlled reclosing of several circuit breakers or circuit breaker poles associated with different phases of the transmission line. The controlled reclosing may respectively be performed, for each phase, in dependence on an output voltage of the voltage transformer or a busbar voltage for the respective phase and in dependence on the product of a shunt reactor impedance and the time derivative of the shunt reactor current measured by the current transformer for the respective phase.

A power system according to an embodiment comprises a power source, a transmission line coupled to the power source through a circuit breaker, a shunt reactor coupled to the transmission line, a current transformer connected in series with a shunt reactor, and the control or protection device according to the invention.

The shunt reactor may be connected to the local end of the transmission line. One or several additional shunt reactors may be connected to the remote end of the transmission line or at other locations.

The power system may further comprise a computing device adapted to calculate the time derivative of the current sensed by the current transformer.

The computing device may be adapted to reconstruct a line voltage signal on the transmission line by multiplying the time derivative of the current sensed by the current transformer by an inductance of the shunt reactor or by another suitable scaling factor.

The current transformer of the power system may comprise a Rogowski coil or a Hall-effect sensor or a similar sensor adapted to measure a current.

The method, control or protection device, and system according to embodiments allow control operations or other operations such as protection operations to be performed in a power network having a transmission line with at least one shunt reactor, without having to rely on potentially inaccurate line voltage measurements in a state in which a circuit breaker has tripped.

A current transformer typically has a better frequency response than a capacitive voltage transformer. The methods and control or protection devices according to embodiments provide increased accuracy of the computed line voltage signal as a basis for a more accurate calculation of a reclosing target, even for different line frequencies.

Embodiments of the invention may be used for controlled reclosing of a circuit breaker after tripping, without being limited thereto.

BRIEF DESCRIPTION OF THE DRAWINGS

The subject-matter of the invention will be explained in more detail with reference to preferred exemplary embodiments which are illustrated in the attached drawings, in which.

DETAILED DESCRIPTION OF EMBODIMENTS

Exemplary embodiments of the invention will be described with reference to the drawings in which identical or similar reference signs designate identical or similar elements. While some embodiments will be described in the context of controlled reclosing of a circuit breaker (CB) after tripping, the embodiments are not limited thereto. The features of embodiments may be combined with each other, unless specifically noted otherwise.

While the power system and its components are described and shown in single-phase representation, it is generally to be understood that a power system and its components usually comprise three phases. However, the invention with its embodiments is not limited to a specific number of system phases.

Figure 1:
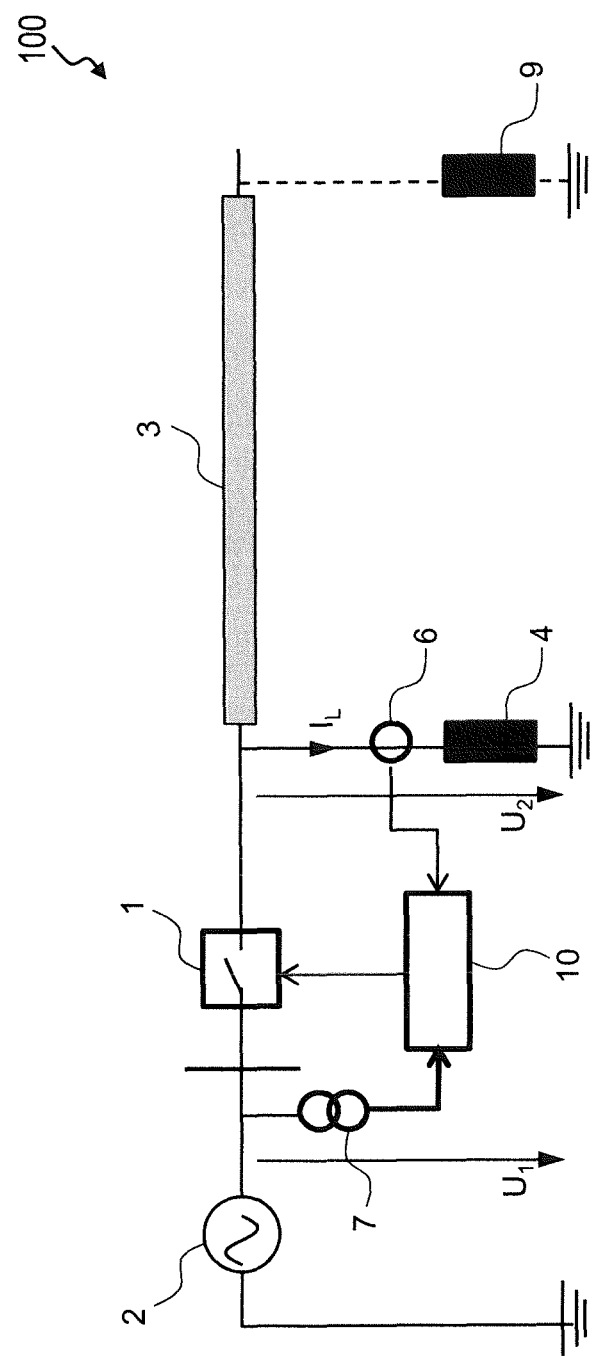
FIG. 1 is a schematic representation of a power system comprising a control or protection device according to an embodiment.

FIG. 1 is a schematic representation of a power system according to an embodiment. The power system may be a high voltage power system or a medium voltage power system.

The power system may comprise a power source 2 and a CB 1. The CB 1 is arranged to connect a transmission line 3 to the power source 2 when the CB 1 is closed and to disconnect the transmission line 3 from the power source 2 when the CB 1 is open. The transmission line 3 may be equipped with one or more shunt reactors 4, 9. The shunt reactor(s) 4, 9 is/are operative to compensate a capacitance of the transmission line 3. The shunt reactor 4 is arranged at the local end of the transmission line, close to the CB 1. Another shunt reactor 9 may be arranged on the far end of the transmission line 3 or in another location along the transmission line 3, but is not required for the techniques of this disclosure.

A control or protection device 10 may perform controlled reclosing of the CB 1 after tripping. The control or protection device 10 may be or may comprise a point-on-wave controller. The control or protection device 10 may be adapted to predict differential voltage signals across the CB 1 when the CB 1 is open to determine a target time for reclosing.

Figure 6:
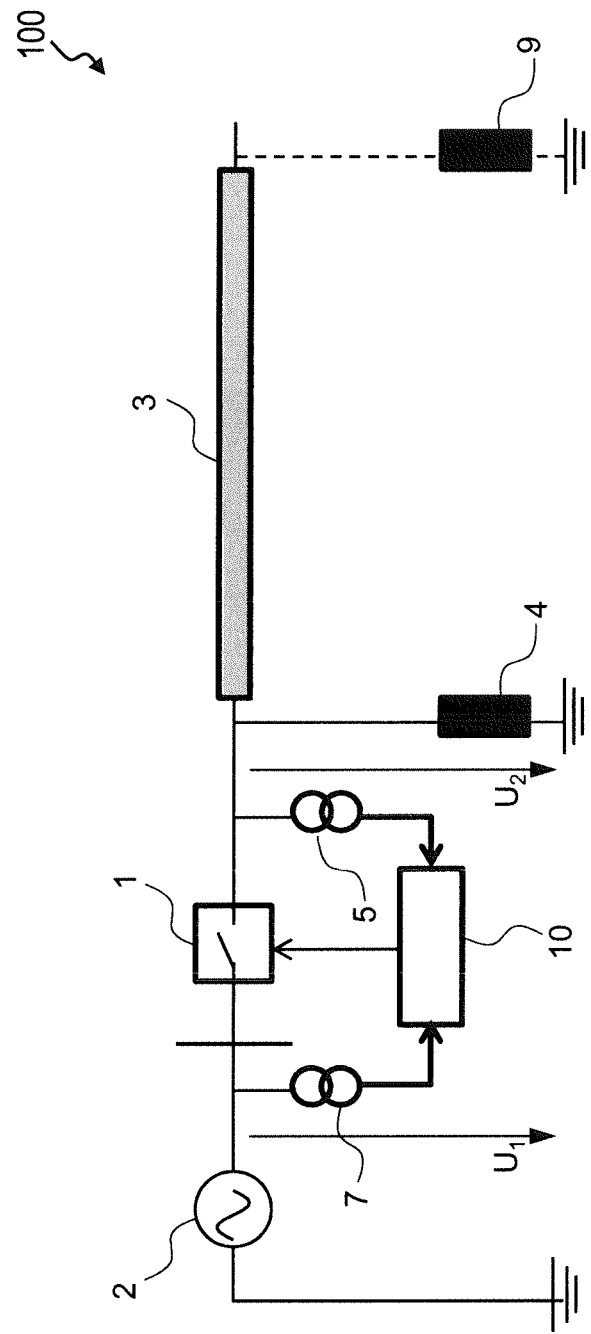
FIG. 6 is a schematic representation of a power system employing a conventional control structure for controlled reclosing.

Contrary to conventional control strategies that use a voltage transformer 5 for directly measuring a line voltage $U_2$ for identifying future beat minima (as illustrated in FIG. 6 and as explained above), the control or protection device 10 performs controlled reclosing using a source voltage $U_1$ and calculated (rather than measured) line voltage $L \cdot dI_L/dt$ derived from a time derivative of a shunt reactor current $I_L$. The control or protection device 10 may predict future beat minima at which a voltage difference across the open CB 1 is minimum, based on the measured source voltage $U_1$ and the calculated line voltage $L \cdot dI_L/dt$ derived from the time derivative of the shunt reactor current $I_L$ to determine the target reclosing time of the CB 1. The target reclosing time may be determined individually for separate phases or poles of the CB 1. The control or protection device 10 may be adapted to forward individual reclosing commands to each circuit breaker pole, in accordance with the predicted future minima of the beat of the voltage difference across the open CB 1.

In order to provide the shunt reactor current, the power system 10 may comprise a current transformer 6 connected in series with the shunt reactor 4. A series connection of the current transformer 6 and the shunt reactor 4 may be connected between an end of the transmission line 3 and ground.

Figure 2:
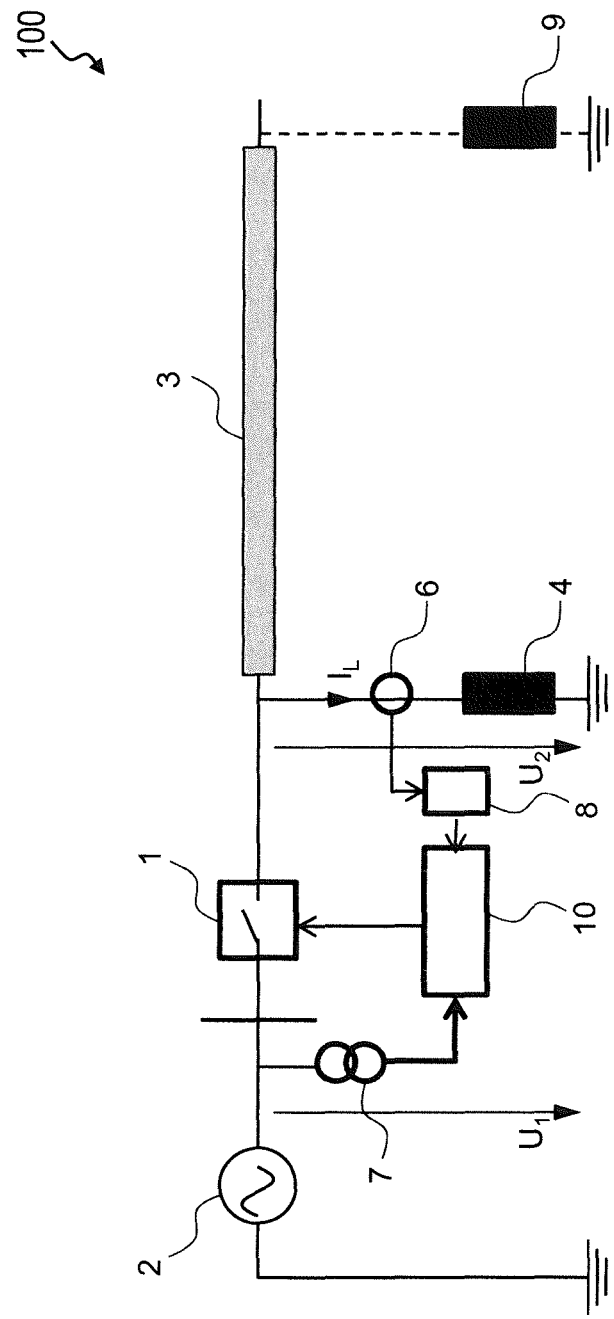
FIG. 2 is a schematic representation of a power system comprising a control or protection device according to an embodiment, wherein a computing device separate from the control or protection device is provided.

The control or protection device 10 may comprise circuitry to calculate the time derivative of the shunt reactor current $I_L$ sensed by the current transformer 6. The circuitry may comprise an integrated semiconductor circuit such as a processor, controller, or application specific integrated circuit that is programmed to calculate the time derivative. In another embodiment, as illustrated in FIG. 2, a separate computing device 8 may be connected between the current transformer 6 and the control or protection device 10. The computing device 8 may compute the time derivative of the shunt reactor current $I_L$ sensed by the current transformer 6. The computing device 8 may provide the time derivative of the shunt reactor current $I_L$ sensed by the current transformer 6, or the reconstructed line voltage signal on the transmission line 3 obtained by multiplying the time derivative of the shunt reactor current $I_L$, sensed by the current transformer 6 by an inductance of the shunt reactor 4 or by another suitable scaling factor, to the control or protection device 10.

Figure 3:
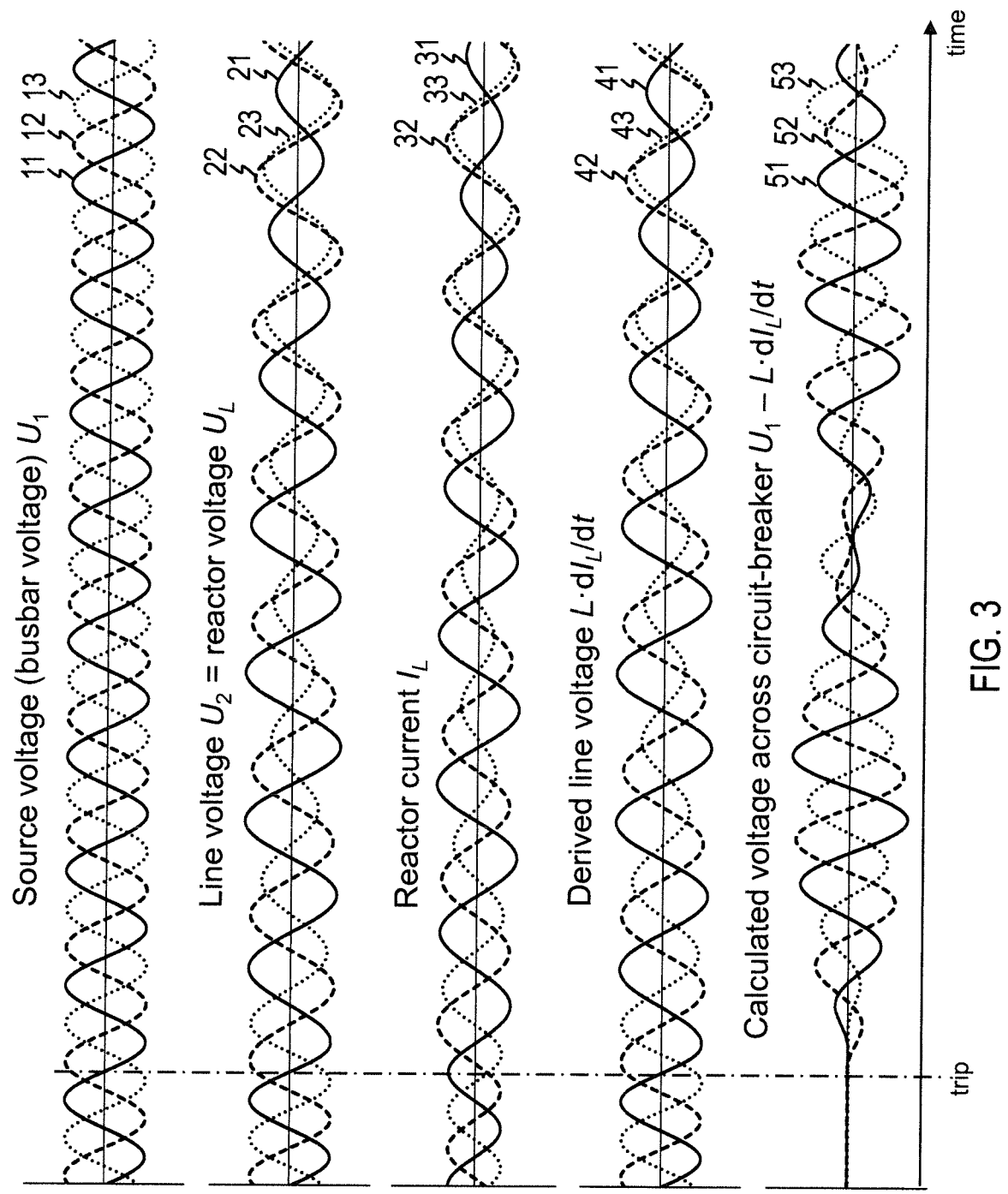
FIG. 3 illustrates signals for different phases of a power system.

The control or protection device 10 or computing device 8 may use the output signal of the current transformer 6 arranged in series with the local shunt reactor 4 to reconstruct the voltage signal $U_2$ on the local end of the transmission line 3. According to the basic electrical equation of a reactor, $$U_L = L \cdot \frac{dI_L}{dt}, \quad (1)$$

the time derivative of the shunt current signal $I_L$ is calculated and multiplied by the inductance L of the shunt reactor to yield the voltage $U_L$ across the shunt reactor, which is equal to the line voltage signal $U_2 = U_L$. Example waveforms are shown in FIG. 3, which reflect that $U_2 = U_L$.

The differential voltage $U_{CB}$ across the CB 1 after tripping may be determined using the calculated voltage $U_L$, $$U_{CB} = U_1 - L \cdot \frac{dI_L}{dt}. \quad (2)$$

The beat pattern in the differential voltage $U_{CB}$ across the CB 1 may be used by the control or protection device 10 to predict future minima of the beat, e.g., based on the recurring pattern of previous beats in $U_{CB}$.

The calculation of the derived line voltage $U_L$ can be performed through an analog circuit or numerically, from sampled current values (obtained by the point-on-wave controller itself or via a digital communication system). The calculation can be done by the control or protection device 10, as illustrated in FIG. 1, or by a separate computing device 8 interposed between CT 6 and control or protection device 10, as illustrated in FIG. 2. Instead of the inductance value L in equation (1) a different scaling factor may be applied, for example to match the input ratings of the control or protection device 10.

The current transformer 6 may comprise a Rogowski coil, which by definition outputs a time derivative of the measured reactor current. In such an embodiment, the step of calculating the derivative of the shunt reactor current signal $I_L$ is implicitly included in the measurement of the shunt reactor current signal, and the derived line voltage signal $U_2 = U_L$ is obtained simply by appropriate scaling of the output signal of the Rogowski coil, for example to satisfy equation 1.

While operation of the control or protection device 10 has been explained with reference to one phase, the power system 10 typically has several phases. A transmission line 3, shunt reactor 4, current transformer 6 and voltage transformer 7 may respectively be provided for each one of the various phases. The control or protection device 10 may initiate controlled reclosing of the circuit breaker 1 or of several circuit breaker poles for any of the plural phases that have been tripped, using the techniques described herein.

FIG. 3 shows waveforms 11, 12, 13 of the source voltage $U_1$ for three different phases, the waveforms 21, 22, 23 of the line voltage $U_2$ for the three different phases, the waveforms 31, 32, 33 of the reactor current $I_L$ for the three different phases, and the waveforms 41, 42, 43 of the calculated line voltage $U_L$ determined in accordance with equation (1) from the time derivative of the shunt reactor current. As seen in FIG. 3, the calculated line voltage $U_L$ determined in accordance with equation (1) from the time derivative of the shunt reactor current matches the line voltage $U_2$ that would be obtained from a voltage transformer having good frequency response characteristics. The differential voltage $U_{CB}$ across the CB 1 when the CB 1 has tripped, calculated in accordance with equation (2), allows the beat minima of the differential voltage to be predicted with good accuracy.

Current transformers 6 usually have a better frequency response than capacitive voltage transformers 5. Hence, the accuracy of the derived line voltage signal $U_L$ determined in accordance with equation (1) is suitable for calculating a correct reclosing target, even at line frequencies significantly different from nominal power frequency.

Figure 4:
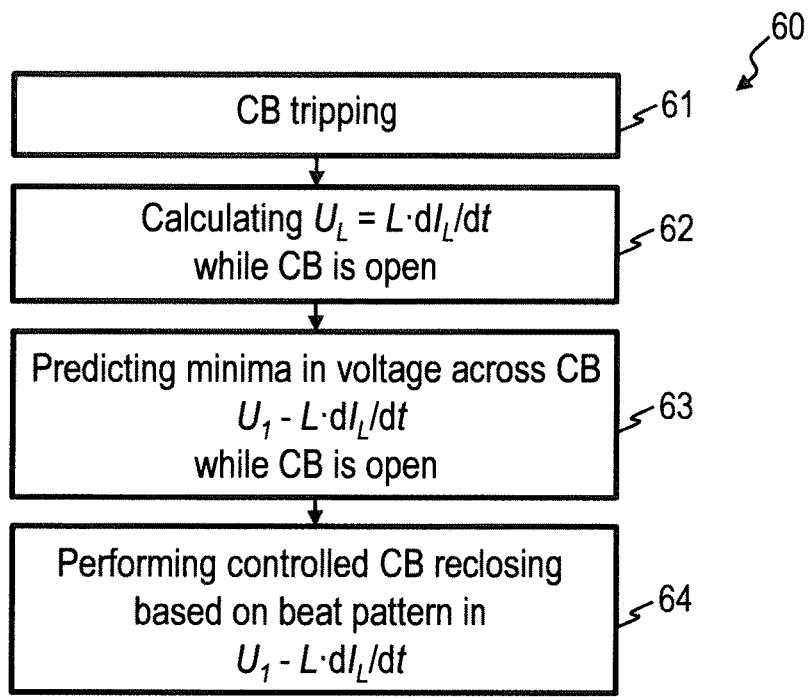
FIG. 4 is a flow chart of a method according to an embodiment.

FIG. 4 is a flow chart of a method 60 according to an embodiment. The method 60 may be performed to implement controlled reclosing of the CB 1 after tripping.

At step 61, the CB 1 of a power system may be tripped.

At step 62, the time derivative of the shunt current signal $I_L$ measured while the CB 1 is open may be calculated and multiplied by the inductance L of the shunt reactor, in accordance with equation (1), to yield a voltage that is equal to the line voltage signal $U_2 = U_L$. Instead of the inductance value L, another suitable scaling factor may be applied.

At step 63, the differential voltage $U_{CB}$ across the CB 1 after tripping may be determined in accordance with equation (2). A beat pattern in the differential voltage $U_{CB}$ across the CB 1 after tripping may be used to predict future minima in $U_{CB}$.

At step 64, controlled reclosing of the CB 1 may be performed using the beat pattern in the differential voltage $U_{CB}$ across the CB 1 after tripping determined in step 63. Target reclosing times may be set so that the various poles of the CB 1 are reclosed at beat minima of the differential voltage $U_{CB}$ for the respective phases.

The inductance L of the shunt reactor 4 may be read from a physical rating plate of the shunt reactor 4, from a data sheet of the shunt reactor 4, or from a computerized record representing technical data of the shunt reactor 4. The inductance L may be input into the control or protection device 10, for example, via a user interface or via a data interface.

Alternatively or additionally, a calibration routine may be executed to determine the inductance L of the shunt reactor 4.

Figure 5:
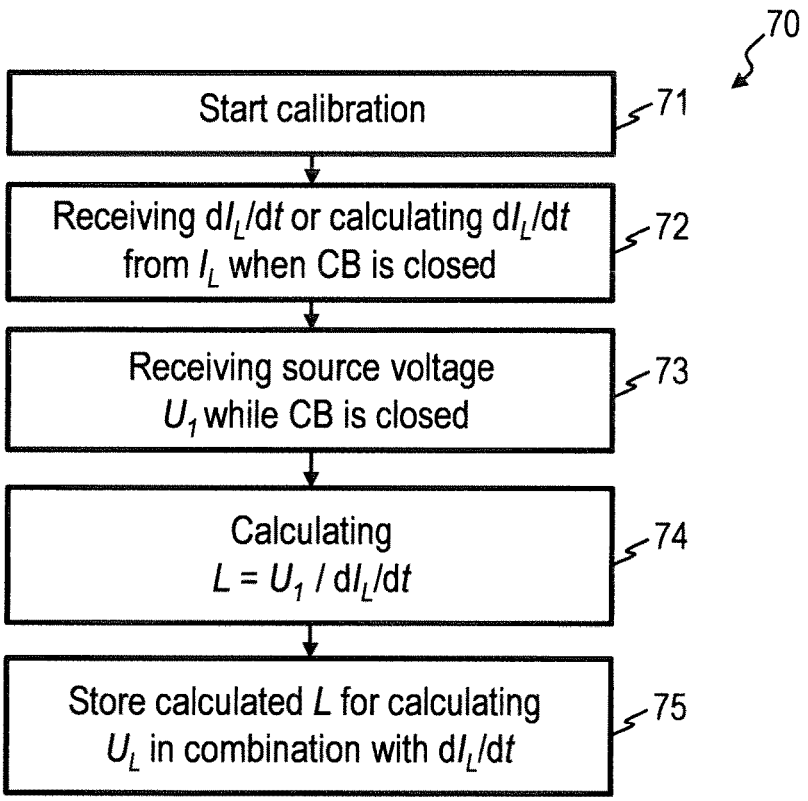
FIG. 5 is a flow chart of a method that comprises a calibration according to an embodiment.

FIG. 5 is a flow chart of a method 70 according to an embodiment. The method 70 may be performed to determine the inductance L of the shunt reactor 4 in a calibration.

At step 71, the calibration is started.

At step 72, the time derivative $dI_L/dt$ of the shunt reactor current signal $I_L$ measured while the CB 1 is closed may be received or calculated from the shunt reactor current signal $I_L$.

At step 73, the source voltage $U_1$ measured by the VT 7 while the CB 1 is closed may be received.

At step 74, the inductance L of the shunt reactor 4 may be calculated based on the source voltage $U_1$ measured by the VT 7 while the CB 1 is closed and based on the time derivative $dI_L/dt$ of the shunt reactor current signal $I_L$ measured while the CB 1 is closed. Instead of the source voltage $U_1$ measured by the VT 7, the load voltage $U_2$ measured by the VT 5 may be used while the CB 1 is closed.

At step 75, the calculated inductance L of the shunt reactor 4 may be stored in the control or protection device 10 or in the computing device 8, for use in combination with the time derivative $dI_L/dt$ of the shunt reactor current signal $I_L$ measured while the CB 1 is open to calculate the line voltage $U_L$ in accordance with equation (1) for controlled circuit breaker reclosing or for other power system related functions.

The calibration routine may be performed while the CB 1 is closed. The calibration routine may use a source voltage $U_1$ measured by the VT 7 while the CB 1 is closed and a time derivative of the shunt current signal $I_L$ measured by the current transformer 6 while the CB 1 is closed. Instead of the source voltage $U_1$ measured by the VT 7, a load voltage $U_2$ measured by load VT 5 may be used while the CB 1 is closed.

In the calibration routine, the inductance L may be determined as $$L = \frac{\hat{U}_1}{\widehat{\frac{dI}{dt}}}, \quad (3)$$

where $\hat{U}_1$ designates a peak value of the source voltage $U_1$ measured by the VT 7 while the CB 1 is closed and $$\widehat{\frac{dI}{dt}}$$

designates a peak value of the time derivative $dI_L/dt$ of the shunt reactor current signal $I_L$ measured by the current transformer 6 while the CB 1 is closed. In equation (3) peaks of the same polarity are used for both $\hat{U}_1$ and $$\widehat{\frac{dI}{dt}}.$$

Instead of using a single peak value, equation (3) may be evaluated by using an average of several peak values of the source voltage $U_1$ measured by the VT 7, or of the load voltage $U_2$ measured by the VT 5, while the CB 1 is closed as $U_1$ and an average of several peak values of the time derivative of the shunt reactor current signal $I_L$ measured by the current transformer 6 while the CB 1 is closed as $$\widehat{\frac{dI}{dt}}.$$

In a similar manner, equation (3) may be evaluated by using the calculated RMS value, or the average of several calculated RMS values, of the source voltage $U_1$ measured by the VT 7, or of the load voltage $U_2$ measured by the VT 5, while the CB 1 is closed as $\hat{U}_1$ and the calculated RMS value, or the average of several calculated RMS values, of the shunt reactor current signal $I_L$ measured by the current transformer 6 while the CB 1 is closed as $$\widehat{\frac{dI}{dt}}.$$

Averages other than RMS may be used instead of the RMS values to calculate the inductance L during calibration.

While a calibration has been explained with reference to one phase, calibration may be performed for each one of plural different phases of a power system using the techniques described herein to determine the inductances of the shunt reactors of the plural different phases of the transmission line. Alternatively, the inductance value calculated in one phase may be applied to all phases, or an inductance value obtained by calculating the average of the inductance values calculated in all phases may be applied to all phases.

While embodiments of the invention have been described in association with controlled reclosing of a circuit breaker after tripping, the methods, devices, and systems may be used for other purposes. For illustration, the output signal of the current transformer 6 may be used to calculate the line voltage, obviating the need for using a voltage transformer 7 as in the conventional system illustrated in FIG. 6. The time derivative of the shunt reactor current may be used for detecting an instant of line de-energization, for detecting an extinction of temporary faults or secondary arcing, for performing one or several protection functions, and/or for line synchronization (e.g., synchro-check).

While the device 10 is referred to as a "control or protection device" herein, it will be appreciated that the device 10 can perform both control and protection functions. The word "or" as used herein is to be understood as being non-exclusive.

While peak values or RMS values of various signals have been described herein in the context of techniques for determining the inductance value of the shunt reactor, other values that are characteristic for a voltage amplitude and an amplitude of a time derivative may be used in the disclosed procedures.

While the invention has been described in detail in the drawings and foregoing description, such description is to be considered illustrative or exemplary and not restrictive. Variations to the disclosed embodiments can be understood and effected by those skilled in the art and practicing the claimed invention, from a study of the drawings, the disclosure, and the appended claims. In the claims, the word "comprising" does not exclude other elements or steps, and the indefinite article "a" or "an" does not exclude a plurality. The mere fact that certain elements or steps are recited in distinct claims does not indicate that a combination of these elements or steps cannot be used to advantage; specifically, in addition to the actual claim dependency, any further meaningful claim combination shall be considered disclosed.

The invention claimed is:

1. A method of controlling at least one circuit breaker of a power system, the power system further comprising a power source, a transmission line, and a voltage transformer connected to the power source and adapted to sense a source voltage of the power source, the at least one circuit breaker connected in series between the power source and the transmission line, a shunt reactor, and a current transformer connected in series between the transmission line and the shunt reactor to measure a current through the shunt reactor, the method comprising:

processing an output signal of the current transformer comprising determining a time derivative of a current sensed by the current transformer; and performing a control operation on the at least one circuit breaker based on the determined time derivative of the current sensed by the current transformer, the control operation comprising a controlled reclosing of the circuit breaker after tripping of the circuit breaker based on an output signal of the voltage transformer and on the time derivative of the current sensed by the current transformer.

2. The method of claim 1, wherein processing the output signal of the current transformer comprises determining a line voltage on the transmission line by multiplying the time derivative of the current sensed by the current transformer by an inductance of the shunt reactor.

3. The method of claim 2 further comprising determining the inductance of the shunt reactor in a calibration that uses the output signal of the voltage transformer measured while the circuit breaker is closed and the time derivative of the current sensed by the current transformer while the circuit breaker is closed.

4. The method of claim 3, wherein the inductance of the shunt reactor is determined based on at least one peak value of the output signal of the voltage transformer while the circuit breaker is closed and at least one peak value of the time derivative of the current sensed by the current transformer while the circuit breaker is closed.

5. The method of claim 3, wherein the inductance of the shunt reactor is determined based on at least one of a calculated root mean square, an RMS, a value of the output signal of the voltage transformer while the circuit breaker is closed, and at least one calculated RMS value of the time derivative of the current sensed by the current transformer while the circuit breaker is closed.

6. The method of claim 1, wherein processing the output signal of the current transformer comprises determining a line voltage on the transmission line based on the time derivative of the current sensed by the current transformer.

7. The method of claim 1, wherein the controlled reclosing of the circuit breaker comprises controlling a target reclosing time at which the circuit breaker is reclosed based on the output signal of the voltage transformer and on the time derivative of the current sensed by the current transformer.

8. The method of claim 1, wherein the reclosing of the circuit breaker is controlled by a control device comprising a point-on-wave controller.

9. The method of claim 1, further comprising using the time derivative of the current sensed by the current transformer to perform at least one of:
   detecting an instant of line de-energization;
   detecting an extinction of temporary faults or secondary arcing;
   at least one protection function; and
   line synchronization.

10. A control device for controlling at least one circuit breaker of a power system, the power system further comprising a power source, a transmission line, and a voltage transformer connected to the power source and adapted to sense a source voltage of the power source, the at least one circuit breaker connected in series between the power source and the transmission line, a shunt reactor, and a current transformer connected in series between the transmission line and the shunt reactor, the control or protection device comprising:
   an input to receive an input signal representing a current sensed by the current transformer; and
   a control circuit adapted to perform a control operation on the at least one circuit breaker based on a time derivative of the current sensed by the current transformer, the control operation comprising a controlled reclosing of the circuit breaker after tripping of the circuit breaker based on an output signal of the voltage transformer and on a line voltage signal derived from the time derivative of the current sensed by the current transformer.

11. The control device of claim 10, wherein the control device comprises a point-on-wave controller adapted to perform controlled reclosing of a circuit breaker after tripping based on an output signal of a voltage transformer connected to the power source and on a line voltage signal derived from the time derivative of the current sensed by the current transformer.

12. The control device of claim 10, wherein the control device is configured to process the input signal to determine the time derivative of a current sensed by the current transformer.

13. A power system, comprising:
   a power source,
   a transmission line;
   a circuit breaker coupled between the power source and the transmission line,
   a shunt reactor,
   a current transformer connected in series between the transmission line and the shunt reactor to measure a current through the shunt reactor, and
   the control device of claim 12.

14. The power system of claim 13, further comprising a computing device adapted to calculate the time derivative of the current sensed by the current transformer.

15. The power system of claim 14, wherein the computing device is adapted to reconstruct a line voltage signal on the transmission line by multiplying the time derivative of the current sensed by the current transformer by an inductance of the shunt reactor or by another suitable scaling factor.

16. A power system comprising:
   a power source;
   a transmission line;
   at least one circuit breaker connected in series between the power source and the transmission line;
   transmission line;
   a shunt reactor coupled to the transmission line; and
   a current transformer connected in series between the transmission line and the shunt reactor to measure a current through the shunt reactor;
   a voltage transformer connected to the power source and adapted to sense a source voltage of the power source; and
   a control device connected to the current transformer, the control device configured to:
      process an output signal of the current transformer comprising determining a time derivative of a current sensed by the current transformer; and
      perform a control operation on the at least one circuit breaker based on the determined time derivative of the current sensed by the current transformer, the control operation comprising a controlled reclosing of the circuit breaker after tripping of the circuit breaker based on an output signal of the voltage transformer and on the time derivative of the current sensed by the current transformer.

17. The control device of claim 16, further comprising:
a voltage transformer connected to the power source,
wherein the control device comprises a point-on-wave controller adapted to perform the controlled reclosing of the circuit breaker.

\* \* \* \* \*